United States Patent
Lee et al.

(10) Patent No.: US 12,334,161 B2
(45) Date of Patent: Jun. 17, 2025

(54) MEMORY DEVICE AND METHOD OF OPERATING THE SAME

(71) Applicant: SK hynix Inc., Icheon-si (KR)

(72) Inventors: Jong Hoon Lee, Icheon-si (KR); Se Chun Park, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 265 days.

(21) Appl. No.: 17/970,079

(22) Filed: Oct. 20, 2022

(65) Prior Publication Data

US 2023/0395169 A1  Dec. 7, 2023

(30) Foreign Application Priority Data

Jun. 2, 2022  (KR) .................. 10-2022-0067450

(51) Int. Cl.
*G11C 16/34* (2006.01)
*G11C 16/10* (2006.01)
*G11C 16/24* (2006.01)

(52) U.S. Cl.
CPC ........ *G11C 16/3459* (2013.01); *G11C 16/102* (2013.01); *G11C 16/24* (2013.01); *G11C 16/3404* (2013.01)

(58) Field of Classification Search
CPC ... G11C 16/3459; G11C 16/102; G11C 16/24; G11C 16/3404
USPC .................................. 365/185.22
See application file for complete search history.

(56) References Cited

U.S. PATENT DOCUMENTS

| 2017/0025183 A1* | 1/2017 | Lee ................... G11C 16/10 |
| 2019/0139609 A1* | 5/2019 | Park ................. G11C 16/3459 |
| 2022/0254421 A1* | 8/2022 | Hwang .............. G11C 16/3459 |

FOREIGN PATENT DOCUMENTS

| KR | 1020150020430 A | 2/2015 |
| KR | 1020200118713 A | 10/2020 |

* cited by examiner

*Primary Examiner* — Amir Zarabian
*Assistant Examiner* — Daniel J King
(74) *Attorney, Agent, or Firm* — WILLIAM PARK & ASSOCIATES LTD.

(57) ABSTRACT

Provided herein may be a memory device and a method of operating the same. The memory device may include a plurality of memory cells, a peripheral circuit configured to perform a verify operation that identifies threshold voltages of the plurality of memory cells by using a first verify voltage and a second verify voltage, and a program operation controller configured to control the peripheral circuit, after the verify operation is terminated and during a period in which a program voltage is applied to the plurality of memory cells, to apply a first control signal to a page buffer that is coupled to a first memory cell having a threshold voltage that is higher than the first verify voltage and lower than the second verify voltage, and apply a second control signal having a lower level voltage than the first control signal to the page buffer.

18 Claims, 11 Drawing Sheets

MEMORY DEVICE AND METHOD OF OPERATING THE SAME

CROSS-REFERENCE TO RELATED APPLICATION

The present application claims priority under 35 U.S.C. § 119(a) to Korean patent application number 10-2022-0067450, filed on Jun. 2, 2022, in the Korean Intellectual Property Office, the entire disclosure of which is incorporated herein by reference.

BACKGROUND

1. Technical Field

Various embodiments of the present disclosure relate to an electronic device, and more particularly to a memory device and a method of operating the memory device.

2. Related Art

A program operation is an operation that increases the threshold voltages of memory cells. Because the physical characteristics of memory cells are different from each other, the degrees to which the threshold voltages of respective memory cells are increased are different from each other during a program operation. Accordingly, in order to form the threshold voltage distributions of memory cells, having the same program state as a target program state, in a narrow shape during a program operation, the memory device applies voltages having different magnitudes to bit lines based on the magnitudes of respective threshold voltages of the memory cells. However, since the distance between lines for the wiring of bit lines becomes less and less, when voltages having different magnitudes are applied to bit lines, a coupling phenomenon attributable to parasitic capacitance between the bit lines may occur. Further, when a coupling phenomenon between bit lines occurs, voltages applied to the bit lines might not be increased to desired levels.

SUMMARY

An embodiment of the present disclosure may provide for a memory device. The memory device may include a plurality of memory cells, a peripheral circuit configured to perform a verify operation that identifies threshold voltages of the plurality of memory cells by using a first verify voltage and a second verify voltage that has a higher voltage than the first verify voltage, and a program operation controller configured to control the peripheral circuit, after the verify operation is terminated and during a period in which a program voltage is applied to the plurality of memory cells, to apply a first control signal having a first voltage magnitude to a page buffer that is coupled to a first memory cell, among the plurality of memory cells, the first memory cell having a threshold voltage that is higher than the first verify voltage and lower than the second verify voltage, and apply a second control signal having a second voltage magnitude that is lower than the first voltage magnitude to the page buffer.

An embodiment of the present disclosure may provide for a method of operating a memory device. The method may include performing a verify operation that identifies threshold voltages of a plurality of memory cells by using a first verify voltage and a second verify voltage that has a higher voltage than the first verify voltage, after the verify operation is terminated and during a period in which a program voltage is applied to the plurality of memory cells: applying a first control signal having a first voltage magnitude to a page buffer that is coupled to a first memory cell, among the plurality of memory cells, the first memory cell having a threshold voltage that is higher than the first verify voltage and lower than the second verify voltage, and applying a second control signal having a second voltage magnitude lower than the first voltage magnitude to the page buffer that is coupled to the first memory cell.

DETAILED DESCRIPTION

Specific structural or functional descriptions in the embodiments of the present disclosure introduced in this specification or application are provided as examples to describe embodiments according to the concept of the present disclosure. The embodiments according to the concept of the present disclosure may be practiced in various forms, and should not be construed as being limited to the embodiments described in the specification or application.

Various embodiments of the present disclosure are directed to a memory device that is capable of improving the threshold voltage distributions of memory cells during a program operation, and a method of operating the memory device.

Figure 1:
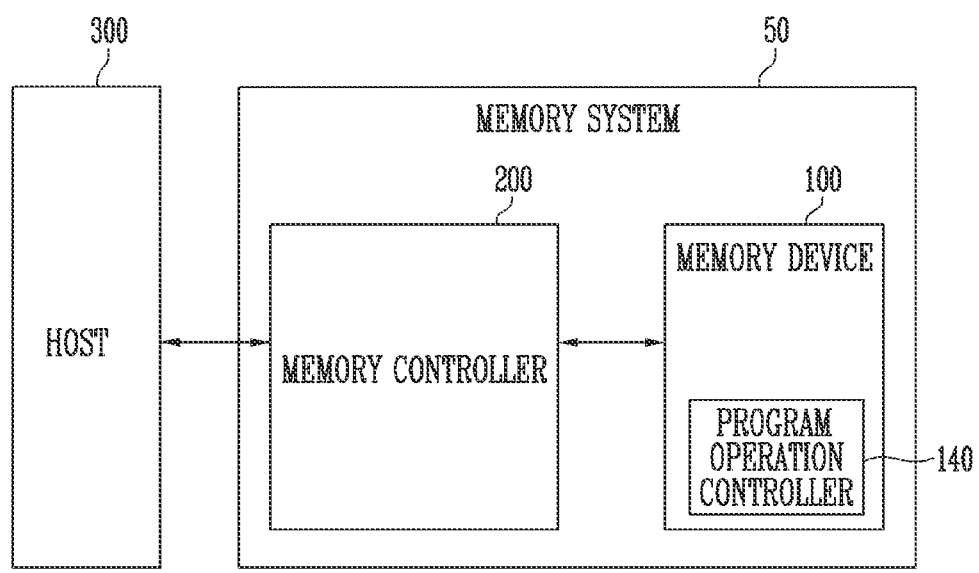
FIG. 1 is a diagram illustrating a memory system including a memory device according to an embodiment of the present disclosure.

FIG. 1 is a diagram illustrating a memory system including a memory device according to an embodiment of the present disclosure.

Referring to FIG. 1, a memory system 50 may include a memory device 100 and a memory controller 200. The memory system 50 may be a device that stores data under the control of a host 300, such as a mobile phone, a smartphone, an MP3 player, a laptop computer, a desktop computer, a game console, a TV, a tablet PC, or an in-vehicle infotainment system.

The memory system 50 may be manufactured as any one of various types of storage devices based on a host interface that is a scheme for communication with the host 300. For example, the memory system 50 may be implemented as any one of various types of storage devices, for example, a solid state drive (SSD), a multimedia card such as an MMC, an embedded MMC (eMMC), a reduced size MMC (RS-MMC), or a micro-MMC, a secure digital card such as an SD, a mini-SD, or a micro-SD, a universal serial bus (USB) storage device, a universal flash storage (UFS) device, a personal computer memory card international association (PCMCIA) card-type storage device, a peripheral component interconnection (PCI)-card type storage device, a PCI express (PCI-E) card-type storage device, a compact flash (CF) card, a smart media card, and a memory stick.

The memory system 50 may be manufactured in any one of various types of package forms. For example, the memory system 50 may be manufactured in any one of various types of package forms, such as package on package (POP), system in package (SIP), system on chip (SOC), multi-chip package (MCP), chip on board (COB), wafer-level fabricated package (WFP), and wafer-level stack package (WSP).

The memory device 100 may store data. The memory device 100 may be operated under the control of the memory controller 200. The memory device 100 may include a memory cell array (not illustrated) including a plurality of memory cells which store data.

Each of the memory cells may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The memory cell array (not illustrated) may include a plurality of memory blocks. Each memory block may include a plurality of memory cells. One memory block may include a plurality of pages. In an embodiment, a page may be the unit by which data is stored in the memory device 100 or the unit by which data that is stored in the memory device 100 is read. A memory block may be the unit by which data is erased.

In an embodiment, the memory device 100 may be implemented as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory, a resistive RAM (RRAM), a phase-change RAM (PRAM), a magnetoresistive RAM (MRAM), a ferroelectric RAM (FRAM), or a spin transfer torque RAM (STT-RAM). For convenience of description, in the present specification, a description is made on the assumption that the memory device 100 is a NAND flash memory.

The memory device 100 may receive a command and an address from the memory controller 200 and may access the area of the memory cell array, selected by the address. The memory device 100 may perform an operation indicated by the command on the area that is selected by the address. For example, the memory device 100 may perform a write operation (i.e., a program operation), a read operation, and an erase operation. During a write operation, the memory device 100 may program data to the area that is selected by the address. During a read operation, the memory device 100 may read data from the area that is selected by the address. During an erase operation, the memory device 100 may erase data that is stored in the area that is selected by the address.

In an embodiment, the memory device 100 may include a program operation controller 140.

The program operation controller 140 may control a program operation that is performed on memory cells. The program operation may be an operation of storing data in the memory cells. In detail, the program operation may be an operation that increases the threshold voltages of memory cells based on the data to be stored in the memory cells. When the program operation is performed, each of the memory cells may have a threshold voltage corresponding to any one of a plurality of program states. The plurality of program states may be defined based on the number of data bits that are stored in one memory cell. For example, when data is programmed in a triple-level cell (TLC) scheme in which three bits of data are stored in one memory cell, the plurality of program states may indicate an erased state and first to seventh program states. After the program operation has been performed, the threshold voltages of the memory cells may be determined based on the data to be stored in the memory cells. Each of the memory cells may have any one of the plurality of program states as a target program state based on the data to be stored in the corresponding memory cell.

In an embodiment, the program operation may include a plurality of program loops. Each program loop may include a program voltage apply operation and a verify operation. The program voltage apply operation may be an operation that increases the threshold voltages of memory cells by using a program voltage. The verify operation may be an operation that identifies, using a verify voltage, whether the threshold voltages of the memory cells have reached threshold voltages corresponding to a target program state.

The program operation controller 140 may determine voltages to be applied to bit lines that are coupled to memory cells in the program voltage apply operation based on the threshold voltages of memory cells that are identified by using the verify voltage. For example, during a verify operation, when the threshold voltages of the memory cells have a higher voltage than the verify voltage corresponding to the target program state, the memory cells may be identified as having reached the target program state. The memory cells having threshold voltages corresponding to the target program state may prevent the threshold voltages thereof from being increased any further. Here, during the program voltage apply operation, the program operation controller 140 may apply a program-inhibit voltage to the bit lines that are coupled to the memory cells having threshold voltages corresponding to the target program state. In an example, during a verify operation, when the threshold voltages of the memory cells are lower than the verify voltage corresponding to the target program state, the memory cells may be identified as having not reached the target program state. The threshold voltages of the memory cells, the threshold voltages of which have not reached the threshold voltages corresponding to the target program state, should be further increased. Here, the program operation controller 140 may apply a program enable voltage to the bit lines that are coupled to the memory cells, which do not have threshold voltages corresponding to the target program state in the program voltage apply operation.

In an embodiment, the verify operation may be an operation that identifies the threshold voltages of memory cells using a plurality of verify voltages. The program operation controller 140 may determine the magnitudes of voltages to be applied to bit lines that are coupled to memory cells in the program voltage apply operation based on the magnitudes of the threshold voltages of memory cells that are identified by using the plurality of verify voltages. For example, in the case of a double verify PGM (DPGM) operation that identifies the threshold voltages of memory cells by using two verify voltages, a program enable voltage may be applied to bit lines that are coupled to memory cells having threshold voltages that are lower than a pre-verify voltage during a program voltage apply operation. During a program voltage apply operation, a precharge voltage may be applied to bit lines that are coupled to memory cells having threshold voltages that have a higher voltage than the pre-verify voltage and lower than a main verify voltage. The magnitude of the main verify voltage may be greater than that of the pre-verify voltage. The main verify voltage may be a threshold voltage corresponding to the target program state of the memory cells. The precharge voltage may have a greater magnitude than the program enable voltage.

The memory controller 200 may control the overall operation of the memory system 50.

When power is applied to the memory system 50, the memory controller 200 may run firmware (FW). When the memory device 100 is a flash memory device, the firmware (FW) may include a host interface layer (HIL) which controls communication with the host 300, a flash translation layer (FTL) which controls communication between the host 300 and the memory device 100, and a flash interface layer (FIL) which controls communication with the memory device 100.

In an embodiment, the memory controller 200 may receive data and a logical block address (LBA) from the host 300, and may translate the logical block address (LBA) into a physical block address (PBA) indicating the address of memory cells which are included in the memory device 100 and in which data is to be stored. In the present specification, the terms "logical block address (LBA)" and "logical address" may be used interchangeably. In the present specification, the physical block address (PBA) and "physical address" may be used interchangeably.

The memory controller 200 may control the memory device 100 so that a write operation, a read operation or an erase operation is performed in response to a request received from the host 300. During a write operation, the memory controller 200 may provide a write command, a physical block address, and data to the memory device 100. During a read operation, the memory controller 200 may provide a read command and a physical block address to the memory device 100. During an erase operation, the memory controller 200 may provide an erase command and a physical block address to the memory device 100.

In an embodiment, the memory controller 200 may internally generate a command, an address, and data regardless of whether a request from the host 300 is received, and may transmit them to the memory device 100. For example, the memory controller 200 may provide the memory device 100 with commands, addresses, and data required in order to perform read operations and write operations that are involved in performing wear leveling, read reclaim, garbage collection, etc.

In an embodiment, the memory controller 200 may control two or more memory devices 100. In this case, the memory controller 200 may control the memory devices 100 based on an interleaving scheme to improve operating performance. The interleaving scheme may be a scheme for controlling the memory devices 100 so that the operations of at least two memory devices 100 are caused to overlap each other.

The host 300 may communicate with the memory system 50 using at least one of various communication methods such as universal serial bus (USB), Serial AT Attachment (SATA), serial attached SCSI (SAS), high speed interchip (HSIC), small computer system interface (SCSI), peripheral component interconnection (PCI), PCI express (PCIe), non-volatile memory express (NVMe), universal flash storage (UFS), secure digital (SD), multimedia card (MMC), embedded MMC (eMMC), dual in-line memory module (DIMM), registered DIMM (RDIMM), and load reduced DIMM (LRDIMM) communication methods.

In an embodiment, the memory system 50 may include a buffer memory (not illustrated). For example, the buffer memory may temporarily store data received from the host 300 or data received from the memory device 100, or may temporarily store metadata (e.g., mapping tables) of the memory device 100. The buffer memory may include volatile memories, such as DRAM, SDRAM, DDR SDRAM, LPDDR SDRAM, and GRAM, or nonvolatile memories, such as FRAM, ReRAM, STT-MRAM, and PRAM.

Figure 2:
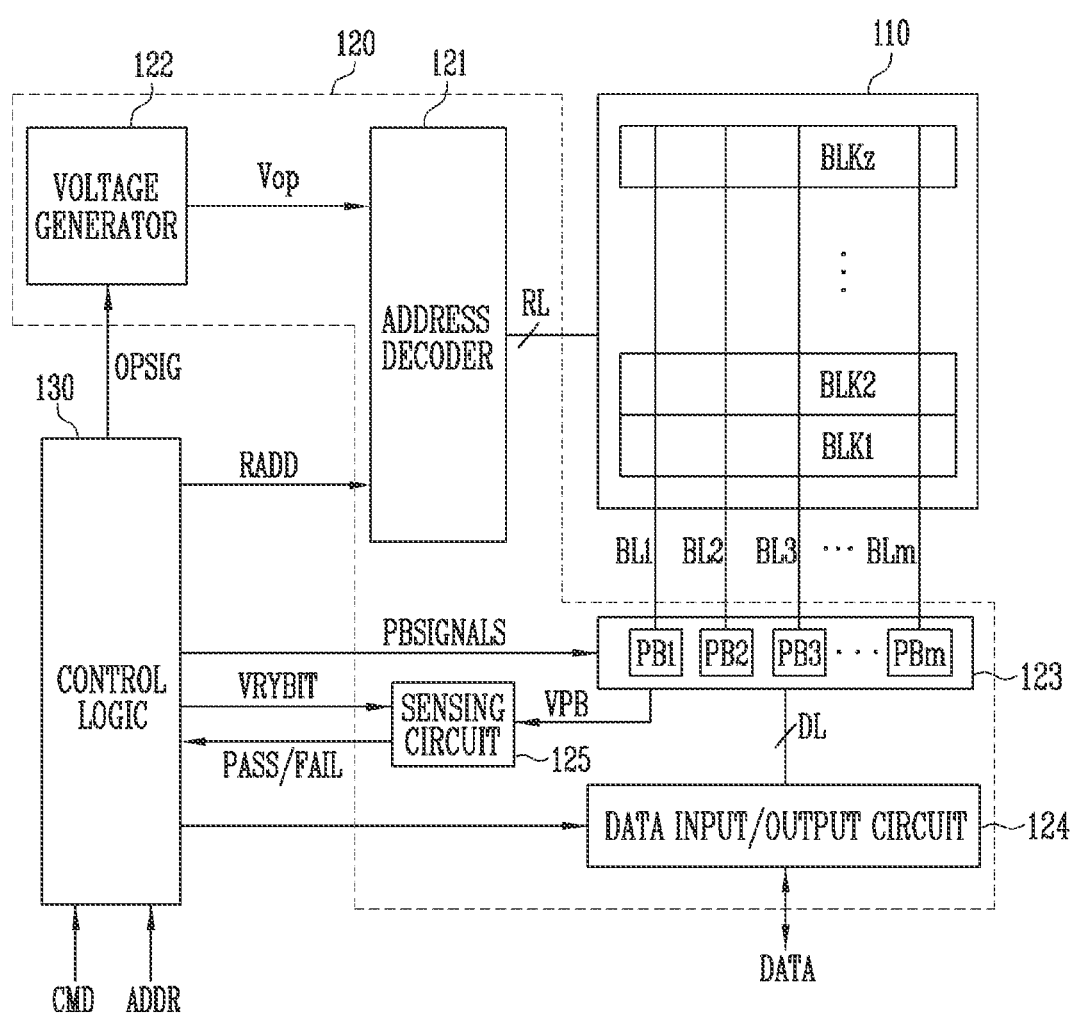
FIG. 2 is a diagram illustrating the structure of the memory device of FIG. 1.

FIG. 2 is a diagram illustrating the structure of the memory device of FIG. 1.

Referring to FIG. 2, the memory device 100 may include a memory cell array 110, a peripheral circuit 120, and a control logic 130.

The memory cell array 110 may include a plurality of memory blocks BLK1 to BLKz. The plurality of memory blocks BLK1 to BLKz may be coupled to an address decoder 121 through row lines RL. The memory blocks BLK1 to BLKz may be coupled to a page buffer group 123 through bit lines BL1 to BLm. Each of the memory blocks BLK1 to BLKz may include a plurality of memory cells. In an embodiment, the plurality of memory cells may be nonvolatile memory cells. Memory cells, among the plurality of memory cells, coupled to the same word line, are defined as one page. In other words, the memory cell array 110 may include a plurality of pages. In an embodiment of the present disclosure, each of the memory blocks BLK1 to BLKz, included in the memory cell array 110, may include a plurality of dummy cells. For the dummy cells, one or more dummy cells may be coupled, in series, between a drain select transistor and memory cells and between a source select transistor and the memory cells.

Each of the memory cells of the memory device 100 may be implemented as a single-level cell (SLC) capable of storing one bit of data, a multi-level cell (MLC) capable of storing two bits of data, a triple-level cell (TLC) capable of storing three bits of data, or a quad-level cell (QLC) capable of storing four bits of data.

The peripheral circuit 120 may drive the memory cell array 110. In an example, the peripheral circuit 120 may drive the memory cell array 110 so that a program operation, a read operation, and an erase operation may be performed under the control of the control logic 130. In an example, the peripheral circuit 120 may apply various operating voltages to the row lines RL and the bit lines BL1 to BLm or may discharge the applied voltages under the control of the control logic 130.

The peripheral circuit 120 may include the address decoder 121, a voltage generator 122, the page buffer group 123, a data input/output circuit 124, and a sensing circuit 125.

The address decoder 121 may be coupled to the memory cell array 110 through the row lines RL. The row lines RL may include drain select lines, word lines, source selection lines, and a common source line. In accordance with an embodiment of the present disclosure, the word lines may include normal word lines and dummy word lines. In accordance with an embodiment of the present disclosure, the row lines RL may further include a pipe select line.

The address decoder 121 may be operated under the control of the control logic 130. The address decoder 121 may receive addresses ADDR from the control logic 130.

The address decoder 121 may decode a block address, among the received addresses ADDR. The address decoder 121 may select at least one of the memory blocks BLK1 to BLKz according to the decoded block address. The address decoder 121 may decode a row address RADD, among the received addresses ADDR. The address decoder 121 may select at least one word line WL of the selected memory block by applying voltages supplied from the voltage generator 122 to the at least one word line WL according to the decoded row address RADD.

During a program operation, the address decoder 121 may apply a program voltage to the selected word line and apply a pass voltage having a lower level than that of the program voltage to unselected word lines. During a program verify operation, the address decoder 121 may apply a verify voltage to the selected word line and may apply a verify pass voltage having a higher level than that of the verify voltage to unselected word lines.

During a read operation, the address decoder 121 may apply a read voltage to the selected word line and may apply a read pass voltage having a higher level than that of the read voltage to unselected word lines.

The erase operation of the memory device 100 may be performed on a memory block basis. During the erase operation, the addresses ADDR that are input to the memory device 100 may include a block address. The address decoder 121 may decode the block address and select one memory block according to the decoded block address. During the erase operation, the address decoder 121 may apply a ground voltage to word lines that are coupled to the selected memory block.

The address decoder 121 may decode a column address among the received addresses ADDR. The decoded column address may be transferred to the page buffer group 123. In an embodiment, the address decoder 121 may include components, such as a row decoder, a column decoder, and an address buffer.

The voltage generator 122 may generate a plurality of operating voltages Vop by using an external supply voltage that is supplied to the memory device 100. The voltage generator 122 may be operated under the control of the control logic 130.

In an embodiment, the voltage generator 122 may generate an internal supply voltage by regulating the external supply voltage. The internal supply voltage that is generated by the voltage generator 122 may be used as an operating voltage for the memory device 100.

In an embodiment, the voltage generator 122 may generate various operating voltages Vop that are used for program, read, and erase operations in response to an operation signal OPSIG. The voltage generator 122 may generate the plurality of operating voltages Vop by using the external supply voltage or the internal supply voltage. The voltage generator 122 may generate various voltages that are required by the memory device 100. For example, the voltage generator 122 may generate a plurality of erase voltages, a plurality of program voltages, a plurality of pass voltages, a plurality of select read voltages, and a plurality of unselect read voltages.

The voltage generator 122 may include a plurality of pumping capacitors that receive the internal supply voltage so as to generate a plurality of operating voltages Vop having various voltage levels and may generate the plurality of operating voltages Vop by selectively enabling the plurality of pumping capacitors under the control of the control logic 130.

The generated operating voltages Vop may be supplied to the memory cell array 110 by the address decoder 121.

The page buffer group 123 includes first to m-th page buffers PB1 to PBm. The first to m-th page buffers PB1 to PBm may be coupled to the memory cell array 110 through the first to m-th bit lines BL1 to BLm, respectively. The first to m-th page buffers PB1 to PBm may be operated under the control of the control logic 130.

The first to m-th page buffers PB1 to PBm may transmit/receive data DATA to/from the data input/output circuit 124. During a program operation, the first to m-th page buffers PB1 to PBm may receive data DATA to be stored through the data input/output circuit 124 and data lines DL.

During a program operation, when a program pulse is applied to a selected word line, the first to m-th page buffers PB1 to PBm may transfer the data DATA to be stored, received through the data input/output circuit 124, to selected memory cells through the bit lines BL1 to BLm. The memory cells in a selected page may be programmed based on the received data DATA. Memory cells that are coupled to a bit line to which a program enable voltage (e.g., a ground voltage) is applied may have increased threshold voltages. The threshold voltages of memory cells that are coupled to a bit line to which a program-inhibit voltage (e.g., a supply voltage) is applied may be maintained. During a program verify operation, the first to m-th page buffers PB1 to PBm may read the data DATA that is stored in the selected memory cells from the selected memory cells through the bit lines BL1 to BLm.

During a read operation, the page buffer group 123 may read data DATA from the memory cells in the selected page through the bit lines BL1 to BLm and may store the read data DATA in the first to m-th page buffers PB1 to PBm.

During an erase operation, the page buffer group 123 may allow the bit lines BL1 to BLm to float. In an embodiment, the page buffer group 123 may include a column select circuit.

In an embodiment, while pieces of data that are stored in some of the plurality of page buffers included in the page buffer group 123 are being programmed to the memory cell array 110, the remaining page buffers may receive new data from the memory controller 200 and then store the new data.

The data input/output circuit 124 may be coupled to the first to m-th page buffers PB1 to PBm through the data lines DL. The data input/output circuit 124 may be operated under the control of the control logic 130.

The data input/output circuit 124 may include a plurality of input/output buffers (not illustrated) which receive input data DATA. During a program operation, the data input/output circuit 124 receives the data DATA to be stored from an external controller (not illustrated). During a read operation, the data input/output circuit 124 may output the data DATA, received from the first to m-th page buffers PB1 to PBm that are included in the page buffer group 123, to the external controller.

During a read operation or a verify operation, the sensing circuit 125 may generate a reference current in response to an enable bit signal VRYBIT generated by the control logic 130 and may output a pass signal or a fail signal to the control logic 130 by comparing a sensing voltage VPB that is received from the page buffer group 123 with a reference voltage that is generated by the reference current. In an example, the sensing circuit 125 may output a pass signal to the control logic 130 when the magnitude of the sensing voltage VPB is less than that of the reference voltage. In an example, the sensing circuit 125 may output a fail signal to the control logic 130 when the magnitude of the sensing voltage VPB is less than that of the reference voltage.

The control logic 130 may be coupled to the address decoder 121, the voltage generator 122, the page buffer group 123, the data input/output circuit 124, and the sensing circuit 125. The control logic 130 may control the overall operation of the memory device 100. The control logic 130 may be operated in response to a command CMD that is transferred from an external device.

The control logic 130 may control the peripheral circuit 120 by generating various types of signals in response to the command CMD and addresses ADDR. For example, the control logic 130 may generate an operation signal OPSIG, the row address RADD, page buffer control signals PBSIGNALS, and the enable bit VRYBIT in response to the command CMD and the addresses ADDR. The control logic 130 may output the operation signal OPSIG to the voltage generator 122, output the row address RADD to the address decoder 121, output the page buffer control signals PBSIGNALS to the page buffer group 123, and output the enable bit VRYBIT to the sensing circuit 125. In addition, the control logic 130 may determine whether a verify operation has passed or failed in response to the pass signal PASS or fail signal FAIL that is output from the sensing circuit 125.

The program operation controller 140 illustrated in FIG. 1 may be included in the control logic 130 illustrated in FIG. 2.

The program operation controller 140 may control the peripheral circuit 120 so that operating voltages to be used in the program operation are applied to the row lines RL and the bit lines BL1 to BLm. The program operation controller 140 may determine voltages to be applied to bit lines that are coupled to memory cells in a program voltage apply operation based on the threshold voltages of memory cells, identified as a result of the verify operation. In an embodiment, the program operation controller 140 may provide the page buffer group 123 with page buffer control signals PBSIGNALS that are required for applying a program enable voltage, a precharge voltage, and a program-inhibit voltage to bit lines that are coupled to memory cells based on the threshold voltages of the memory cells. Each of the page buffers PB1 to PBm that is included in the page buffer group 123 may increase the potential of the corresponding bit line to the program enable voltage, the precharge voltage, or the program-inhibit voltage in response to the page buffer control signals PBSIGNALS that are received from the control logic 130.

Figure 3:
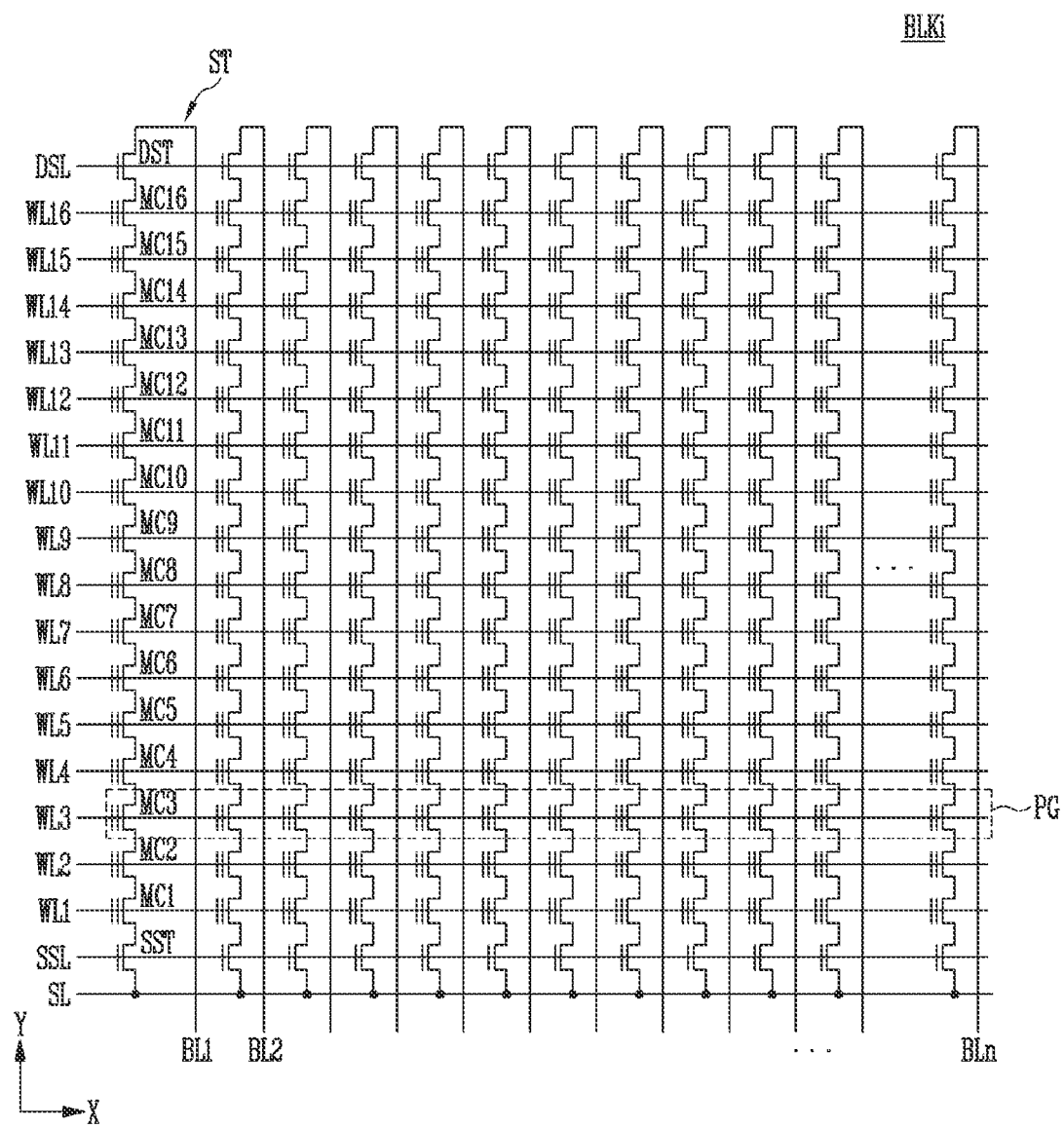
FIG. 3 is a diagram illustrating the structure of any one of a plurality of memory blocks BLK1 to BLKz of FIG. 2.

FIG. 3 is a diagram illustrating the structure of any one of a plurality of memory blocks BLK1 to BLKz of FIG. 2.

A memory block BLKi may indicate any one memory block BLKi, among the memory blocks BLK1 to BLKz, illustrated in FIG. 2.

Referring to FIG. 3, a plurality of word lines that are arranged in parallel to each other may be coupled between a first select line and a second select line. Here, the first select line may be a source select line SSL, and the second select line may be a drain select line DSL. In detail, the memory block BLKi may include a plurality of strings ST that are coupled between bit lines BL1 to BLn and a source line SL. The bit lines BL1 to BLn may be coupled to the strings ST, respectively, and the source line SL may be coupled in common to the strings ST. The strings ST may be equally configured, and thus, the string ST that is coupled to the first bit line BL1 will be described in detail by way of example.

The string ST may include a source select transistor SST, a plurality of memory cells MC1 to MC16, and a drain select transistor DST, which are coupled in series to each other between the source line SL and the first bit line BL1. A single string ST may include at least one source select transistor SST and at least one drain select transistor DST and may include more memory cells than the memory cells MC1 to MC16, illustrated in the drawing.

A source of the source select transistor SST may be coupled to the source line SL, and a drain of the drain select transistor DST may be coupled to the first bit line BL1. The memory cells MC1 to MC16 may be coupled in series between the source select transistor SST and the drain select transistor DST. Gates of the source select transistors SST that are included in different strings ST may be coupled to the source select line SSL, gates of the drain select transistors DST that are included in different strings ST may be coupled to the drain select line DSL, and gates of the memory cells MC1 to MC16 may be coupled to a plurality of word lines WL1 to WL16, respectively. A group of memory cells, among the memory cells included in different strings ST, coupled to the same word line may be referred to as a 'physical page (PG)'. Therefore, the memory block BLKi may include a number of physical pages (PG) identical to the number of word lines WL1 to WL16.

One memory cell may store one bit of data. This cell is typically designated as a "single-level cell (SLC)". In this case, one physical page (PG) may store data corresponding to one logical page (LPG). The data corresponding to one logical page (LPG) may include a number of data bits that are identical to the number of cells included in one physical page (PG).

One memory cell may store two or more bits of data. In this case, one physical page (PG) may store data corresponding to two or more logical pages (LPG).

Figure 4:
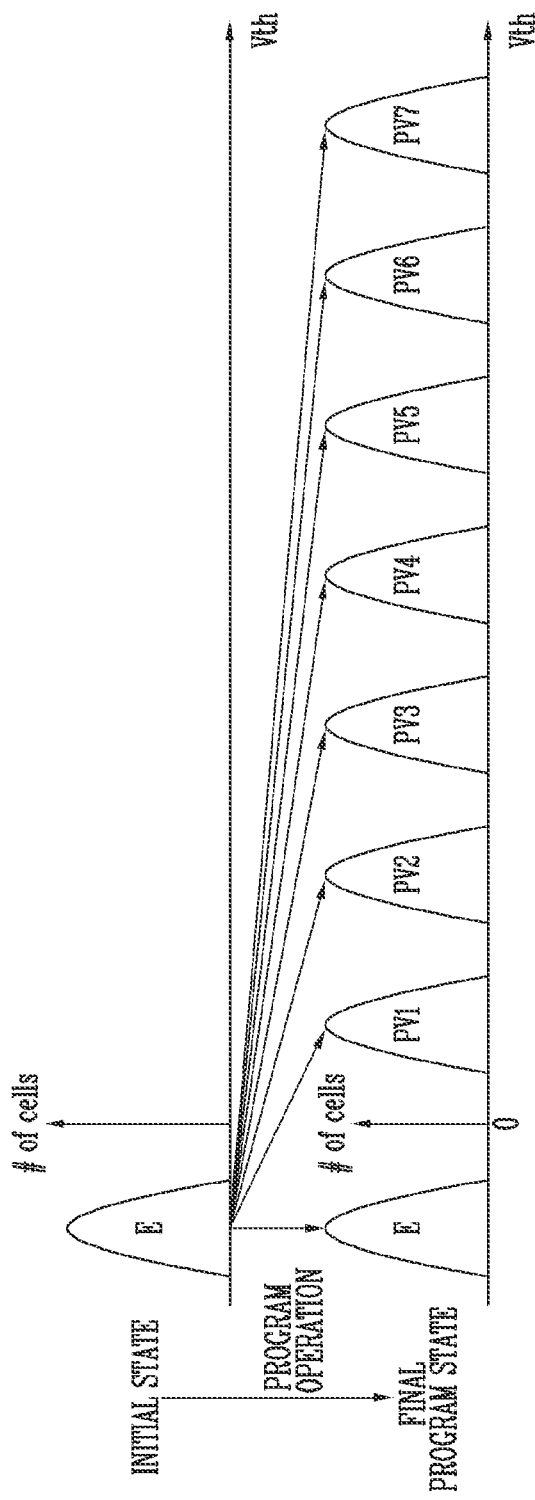
FIG. 4 is a diagram illustrating the threshold voltage distributions of memory cells based on a program operation of a memory device.

FIG. 4 is a diagram illustrating threshold voltage distributions of memory cells based on a program operation of a memory device.

In FIG. 4, the horizontal axis of a graph indicates threshold voltages Vth of memory cells, and the vertical axis of the graph indicates the number of memory cells (# of cells).

Referring to FIG. 4, the threshold voltage distributions of memory cells may be changed from an initial state to a final program state based on the program operation.

In FIG. 4, a description is made on the assumption that data is programmed through a TLC scheme in which one memory cell stores three bits of data.

The initial state may be a state in which a program operation is not performed and in which the threshold voltage distributions of memory cells are in an erase state E.

The final program state may be the threshold voltage distribution of memory cells on which a program operation is performed. Each of the memory cells on which the program operation is performed may have a threshold voltage corresponding to any one of a plurality of program states. For example, when data is programmed in a triple-level cell (TLC) scheme in which three bits of data are stored in one memory cell, the plurality of program states may indicate the erased state E and first to seventh program states PV1 to PV7. In an embodiment, each of the memory cells on which the program operation is performed may have a threshold voltage corresponding to the erased state E or any one of the first to seventh program states PV1 to PV7. The threshold voltage of each memory cell in the initial state may increase to the threshold voltage corresponding to the erased state E or any one of the first to seventh program states PV1 to PV7 through the program operation.

Each memory cell may have the erased state E or any one of the program states PV1 to PV7 as a target program state. The target program state may be determined based on the data to be stored in the corresponding memory cell. The memory cells may have threshold voltages corresponding to the target program state, among the final program states, through respective program operations.

Figure 5:
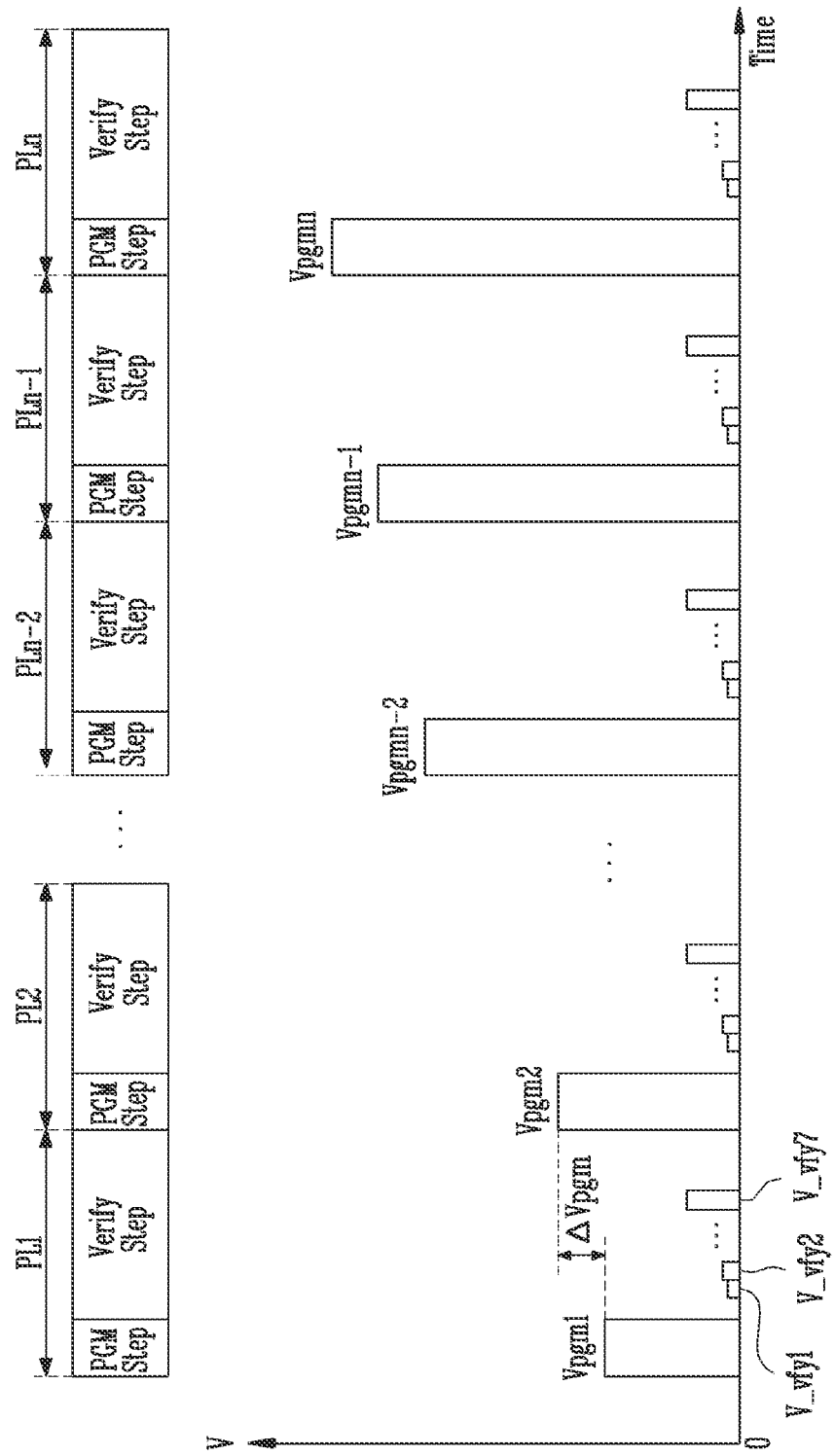
FIG. 5 is a diagram illustrating a program operation of a memory device.

FIG. 5 is a diagram illustrating the program operation of the memory device.

In FIG. 5, the horizontal axis of a graph indicates time and the vertical axis thereof indicates voltage V applied to word lines. The voltage V applied to the word lines may include a program voltage Vpgm and a verify voltage V_vfy.

In FIG. 5, a description is made on the assumption that data is programmed through a TLC scheme in which one memory cell stores three bits of data. However, the scope of the present disclosure is not limited thereto, and a single memory cell may be programmed to store two or fewer bits of data or to store four or more bits of data.

Referring to FIG. 5, the program operation of the memory device 100 may include a plurality of program loops PL1 to PLn. The memory device 100 may perform a program operation so that each of selected memory cells coupled to a selected word line has a threshold voltage corresponding to any one of a plurality of program states by performing the plurality of program loops PL1 to PLn. For example, when a single memory cell is programmed in a TLC scheme, the memory device 100 may perform a program operation so that the memory cell has a threshold voltage corresponding to any one of an erased state E and first to seventh program states PV1 to PV7 by performing the plurality of program loops PL1 to PLn.

Each of the plurality of program loops PL1 to PLn may include a program voltage apply operation (PGM Step) and a verify operation (Verify Step).

The program voltage apply operation (PGM Step) may be an operation that applies a program voltage to a selected word line that is coupled to the selected memory cells. For example, the memory device 100 may apply a first program voltage Vpgm1 to the selected word line that is coupled to selected memory cells in the first program loop PL1. After the first program voltage Vpgm1 is applied to the selected word line, respective threshold voltages of the selected memory cells may be the threshold voltages corresponding to target program states, among the plurality of program states.

The verify operation (Verify Step) may be an operation that applies a verify voltage to the selected word line that is coupled to the selected memory cells. The verify operation (Verify step) may be an operation that determines whether respective threshold voltages of the selected memory cells are threshold voltages corresponding to the target program states, among the plurality of program states. The verify operation (Verify Step) may be an operation that applies verify voltages corresponding to respective target program states of the selected memory cells.

In an embodiment, in the first program loop PL1, after the first program voltage Vpgm1 is applied to the selected word line that is coupled to the selected memory cells, the memory device 100 may apply first to seventh verify voltages V_vfy1 to V_vfy7 to the selected word line. In this case, the verify operation (Verify Step) may be performed on memory cells having a first program state as the target program state by using the first verify voltage V_vfy1. The verify operation (Verify Step) may be performed on memory cells having a second program state as the target program state by using the second verify voltage V_vfy2. The verify operation (Verify Step) may be performed on memory cells having a third program state as the target program state by using the third verify voltage V_vfy3. The verify operation (Verify Step) may be performed on memory cells having a fourth program state as the target program state by using the fourth verify voltage V_vfy4. The verify operation (Verify Step) may be performed on memory cells having a fifth program state as the target program state by using the fifth verify voltage V_vfy5. The verify operation (Verify Step) may be performed on memory cells having a sixth program state as the target program state by using the sixth verify voltage V_vfy6. The verify operation (Verify Step) may be performed on memory cells having a seventh program state as the target program state by using the seventh verify voltage V_vfy7. The magnitudes of the verify voltages V_vfy1 to V_vfy7 may increase from the first verify voltage V_vfy1 to the seventh verify voltage V_vfy7. In detail, for the magnitudes of the verify voltages V_vfy1 to V_vfy7, the first verify voltage V_vfy1 may be the lowest, and the seventh verify voltage V_vfy7 may be the highest. However, the number of verify voltages is not limited to the present embodiment.

It may be determined that the memory cells having passed the verify operation (verify step), using respective verify voltages V_vfy1 to V_vfy7, have threshold voltages corresponding to the target program states. The memory cells having passed the verify operation (Verify Step) may be program-inhibited in the second program loop PL2. A program-inhibit voltage may be applied to bit lines that are coupled to the program-inhibited memory cells.

It may be determined that the memory cells having failed at the verify step, using respective verify voltages V_vfy1 to V_vfy7, do not have threshold voltages corresponding to the target program states. The memory cells having failed at the verify step may perform the second program loop PL2.

In the second program loop PL2, the memory device 100 may apply a second program voltage Vpgm2, having a higher voltage than the first program voltage Vpgm1 by a unit voltage ΔVpgm, to a selected word line that is coupled to selected memory cells. Thereafter, the memory device 100 may perform the verify operation (Verify Step) of the second program loop PL2 in the same manner as the verify operation (Verify Step) of the first program loop PL1.

Thereafter, the memory device 100 may perform a subsequent program loop in the same manner as the second program loop PL2 a preset number of times.

In an embodiment, when the program operation is not completed within a preset number of program loops, the program operation may fail. When the program operation is completed within a preset number of program loops, the program operation may pass. Whether the program operation is completed may be determined based on whether all of the selected memory cells have passed the verify operation (Verify Step). When all of the selected memory cells have passed the verify operation (Verify Step), a subsequent program loop may not be performed.

In an embodiment, the program voltage may be determined based on an incremental step pulse programming (ISPP) method. The level of the program voltage may be increased or decreased by stages (i.e., by a step voltage) as the program loops PL1 to PLn are repeated. The number of applications of program voltages used in each program loop, the voltage levels of the program voltages, voltage apply times, etc. may be determined in various forms under the control of the memory controller 200.

Figure 6:
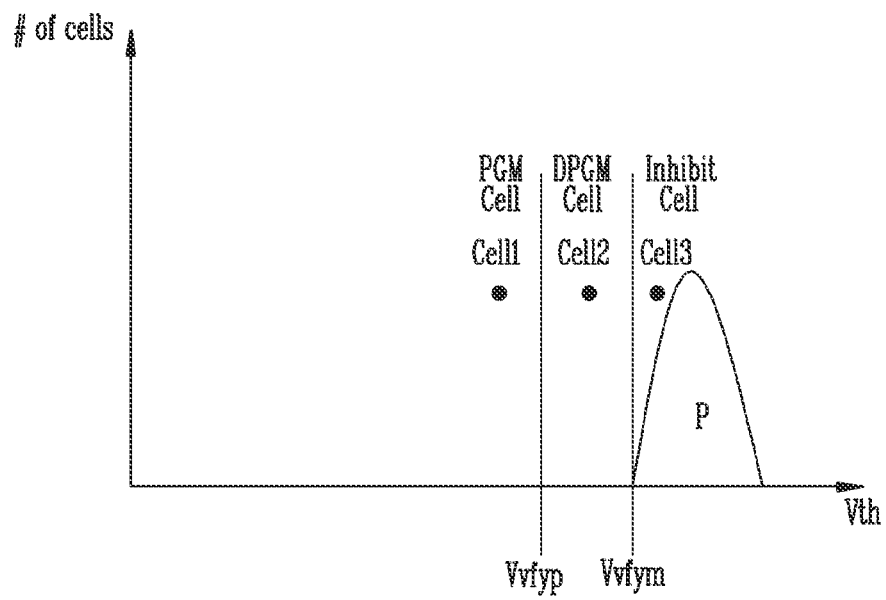
FIG. 6 is a diagram illustrating a DPGM operation of a memory device.

FIG. 6 is a diagram illustrating a DPGM operation of a memory device.

In FIG. 6, the horizontal axis of a graph indicates threshold voltages Vth of memory cells, and the vertical axis thereof indicates the number of memory cells (# of cells).

Referring to FIG. 6, a Double Verify PGM (DPGM) operation may be an operation that identifies the threshold voltages of memory cells by using two or more verify voltages during a verify operation. In detail, the DPGM operation may be an operation of verifying whether the threshold voltages of memory cells have reached threshold voltages corresponding to a target program state by using the two or more verify voltages. The two or more verify voltages may include a pre-verify voltage Vvfyp and a main verify voltage Vvfym.

A program state P, illustrated in FIG. 6, may be any one of the first to seventh program states PV1 to PV7, illustrated in FIG. 4. Each of the verify voltages V_vfy1 to V_vfy7, illustrated in FIG. 5, may include a pre-verify voltage Vvfyp and a main verify voltage Vvfym.

In an embodiment, the main verify voltage Vvfym may be a threshold voltage corresponding to the program state P. The main verify voltage Vvfym may be a threshold voltage corresponding to the target program state of the memory cells. For example, the main verify voltage Vvfym may be any one of the verify voltages V_vfy1 to V_vfy7, illustrated in FIG. 5.

In an embodiment, the threshold voltage of memory cells for which a program voltage apply operation is terminated in any one of a plurality of program loops may be the threshold voltages of first to third cells Cell1 to Cell3. During a verify operation that is performed after the program voltage apply operation is terminated, the memory device 100 may perform a DPGM operation that identifies the threshold voltages of memory cells by using the pre-verify voltage Vvfyp and the main verify voltage Vvfym. During the verify operation, the memory device 100 may perform a DPGM operation that identifies the degrees to which the threshold voltages of memory cells are increased by using the pre-verify voltage Vvfyp and the main verify voltage Vvfym.

In an embodiment, the first cell Cell1 may have a threshold voltage that is lower than the pre-verify voltage Vvfyp after the program voltage apply operation in any one program loop is terminated. The second cell Cell2 may have a threshold voltage that is higher than the pre-verify voltage Vvfyp and lower than the main verify voltage Vvfym. The third cell Cell3 may have a threshold voltage higher than the main verify voltage Vvfym.

In an embodiment, a description is made on the assumption that the target program state of the first to third cells Cell1 to Cell3 is the program state P, illustrated in FIG. 6. That is, the threshold voltages of the first to third cells Cell1 to Cell3 may increase to threshold voltages corresponding to the program state P.

During the program voltage apply operation, the threshold voltage of the first cell Cell1 may increase more to the threshold voltage corresponding to the program state P than the threshold voltage of the second cell Cell2. Here, the first cell Cell1 may be a cell to be programmed (PGM Cell). The threshold voltage of the second cell Cell2 may increase less to the threshold voltage corresponding to the program state P than the threshold voltage of the first cell Cell1. Here, the second cell Cell2 may be a DPGM cell. Because the threshold voltage of the third cell Cell3 has the threshold voltage corresponding to the program state P, the threshold voltage might not be increased any further. Here, the third cell Cell3 may be an inhibit cell.

That is, after the program voltage apply operation is terminated, the degrees to which the threshold voltages of the first to third cells Cell1 to Cell3 are increased may be different from each other. Further, during a verify operation, the degrees to which the threshold voltages of the first to third cells Cell1 to Cell3 are increased may be identified by using the pre-verify voltage Vvfyp and the main verify voltage Vvfym. Thereafter, during the program voltage apply operation that is repeatedly performed, the magnitudes of the voltages that are applied to respective bit lines that are coupled to the first to third cells Cell1 to Cell3 may be determined based on the magnitudes of the threshold voltages of the first to third cells Cell1 to Cell3.

Figure 7:
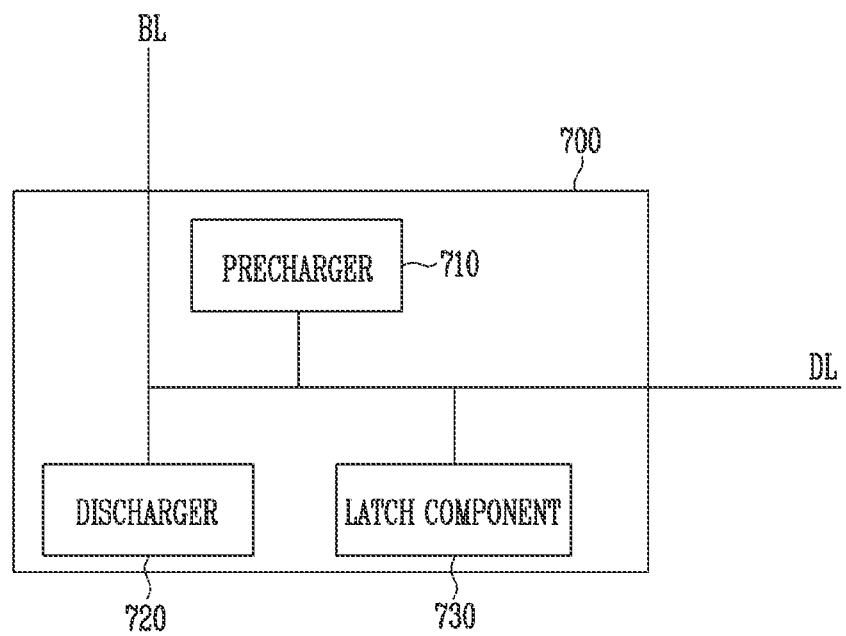
FIG. 7 is a diagram illustrating the operation of a page buffer circuit according to an embodiment of the present disclosure.

FIG. 7 is a diagram illustrating the operation of a page buffer circuit according to an embodiment of the present disclosure.

A page buffer circuit 700, illustrated in FIG. 7, may be any one page buffer PBi, among page buffers that are included in the page buffer group 123, illustrated in FIG. 2.

Referring to FIG. 7, the page buffer circuit 700 may include a precharger 710, a discharger 720, and a latch component 730. The precharger 710, the discharger 720, and the latch component 730 may be coupled between a bit line BL and a data line DL. The bit line BL may be coupled to a memory cell. Data corresponding to the target program state of the memory cell may be input through the data line DL.

The precharger 710 may precharge the voltage of the bit line BL during a program voltage apply operation. In an embodiment, when the memory cell that is coupled to the bit line BL is the cell to be programmed (PGM cell), the precharger 710 may apply a program enable voltage to the bit line BL. The program enable voltage may be a ground voltage. When the memory cell that is coupled to the bit line BL is an inhibit cell, the precharger 710 may apply a program-inhibit voltage to the bit line BL. The program-inhibit voltage may be a supply voltage. When the memory cell that is coupled to the bit line BL is a DPGM cell, the precharger 710 may apply a precharge voltage to the bit line BL. The precharge voltage may be lower than the program-inhibit voltage and higher than the program enable voltage. The precharger 710 may increase the voltage of the bit line BL in response to a precharge control signal PBSENSE that is received from the program operation controller 140 illustrated in FIG. 1. For example, the voltage of the bit line BL may increase to the precharge voltage in response to the precharge control signal PBSENSE. In detail, the degree to which the voltage of the bit line BL is increased may differ based on the magnitude of the voltage of the precharge control signal PBSENSE. As the voltage magnitude of the precharge control signal PBSENSE is greater, the degree to which the voltage of the bit line BL is increased may be higher. In an embodiment, the precharge control signal PBSENSE may be any one of the page buffer control signals PBSIGNALS that are provided from the control logic 130 of FIG. 2 to the page buffer group 123.

The discharger 720 may decrease the voltage of the bit line BL to a ground voltage. In an embodiment, the discharger 720 may discharge the potential of the bit line BL, increased to the program-inhibit voltage or the precharge voltage, to the ground voltage.

The latch component 730 may store data corresponding to the threshold voltage of the memory cell that is identified by using a plurality of verify voltages. The latch component 730 may store data that is obtained by sensing the potential of the bit line that varies when the corresponding verify voltage is applied to the memory cell that is coupled to the bit line BL. In an embodiment, the latch component 730 may store data that identifies whether the memory cell that is coupled to the bit line BL is a cell to be programmed (PGM Cell), a DPGM cell, or an inhibit cell.

Figure 8:
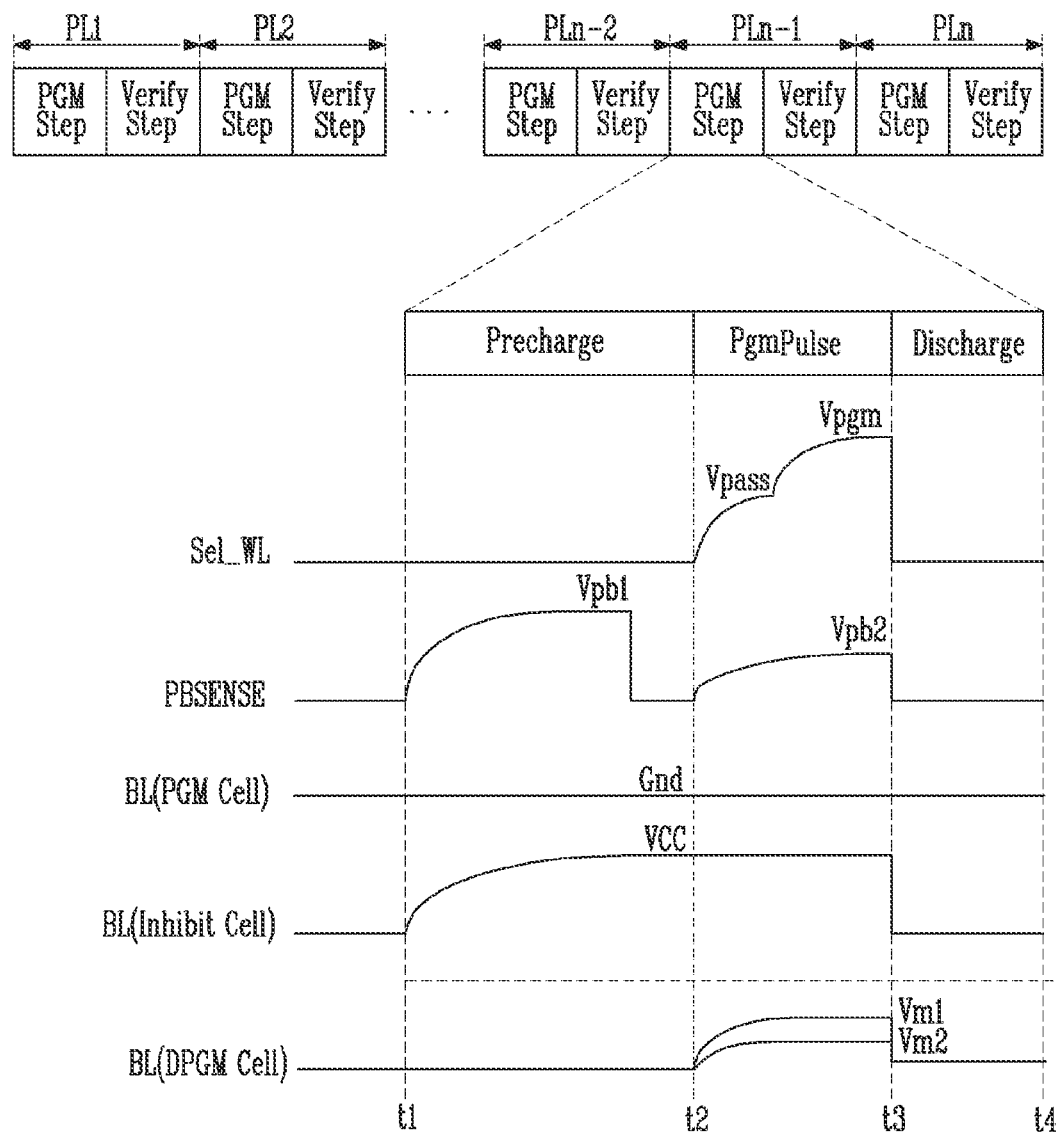
FIG. 8 is a diagram illustrating a program voltage apply operation in a program operation of a memory device.

FIG. 8 is a diagram illustrating a program voltage apply operation in a program operation of a memory device.

Referring to FIG. 8, the program operation of the memory device 100 may include a plurality of program loops PL1 to PLn. Each of the plurality of program loops PL1 to PLn may include a program voltage apply operation (PGM Step) and a verify operation (Verify Step).

The program voltage apply step (PGM Step) that is included in each of the plurality of program loops PL1 to PLn may include a precharge period, a program pulse period (Pgm Pulse), and a discharge period Discharge.

A period from t1 to t2 may be a precharge period. The precharge period may be a period during which the bit line BL is precharged. During the precharge period Precharge, a precharge control signal PBSENSE may rise to a first control voltage Vpb1. The voltage of the bit line BL(Inhibit Cell) that is coupled to an inhibit cell may increase to a program-inhibit voltage VCC in response to the precharge control signal PBSENSE. The memory device 100 may apply a program enable voltage Gnd to a bit line BL(PGM Cell) that is coupled to the cell to be programmed during the precharge period. Thereafter, the precharge control signal PBSENSE may fall from the first control voltage Vpb1 to a ground voltage. Here, the bit line BL(Inhibit Cell) that is coupled to the inhibit cell and the bit line BL(PGM Cell) that is coupled to the cell to be programmed may float. The voltages of the bit line BL(Inhibit Cell) that is coupled to the inhibit cell and the bit line BL(PGM Cell) that is coupled to the cell to be programmed may be maintained.

A period from t2 to t3 may be a program pulse period Pgm Pulse. The program voltages Vpgm1 to Vpgmn, illustrated in FIG. 5, may be applied to a selected word line Sel_WL that is coupled to selected memory cells during the program pulse period Pgm Pulse. The program pulse period Pgm Pulse may be a period during which data is stored in the selected memory cells. For example, during the program pulse period Pgm Pulse, the memory device 100 may apply a pass voltage Vpass to the selected word line Sel_WL that is coupled to the selected memory cells for a preset time, and thereafter apply the program voltage Vpgm to the selected word line Sel_WL. The memory device 100 may maintain the voltage of the bit line BL(PGM Cell) that is coupled to the cell to be programmed at the ground voltage Gnd during the program pulse period Pgm Pulse. The memory device 100 may maintain the voltage of the bit line BL(Inhibit Cell) that is coupled to the inhibit cell at the program-inhibit voltage VCC during the program pulse period Pgm Pulse.

During the program pulse period Pgm Pulse, the precharge control signal PBSENSE may rise to a second control voltage Vpb2. The potential of the bit line BL (DPGM Cell) that is coupled to a DPGM cell may increase in response to the precharge control signal PBSENSE. In detail, the voltage of the bit line BL (DPGM Cell) that is coupled to the DPGM cell may increase to a first precharge voltage Vm1 or a second precharge voltage Vm2. In an example, when memory cells that are adjacent to the DPGM cell are inhibit cells, the voltage of the bit line BL (DPGM Cell) that is coupled to the DPGM cell may increase to the first precharge voltage Vm1. In an example, when memory cells that are adjacent to the DPGM cell are cells to be programmed (PGM cells), the voltage of the bit line BL (DPGM Cell) that is coupled to the DPGM cell may increase to the second precharge voltage Vm2. The first precharge voltage Vm1 may be higher than the second precharge voltage Vm2.

The potential of the bit line BL(DPGM Cell) that is coupled to the DPGM cell may increase to a target level TBL due to the second control voltage Vpb2. However, due to a coupling phenomenon attributable to parasitic capacitance between the bit line BL(DPGM Cell) that is coupled to the DPGM cell and its adjacent bit lines, the voltage of the bit line BL(DPGM Cell) that is coupled to the DPGM cell might not increase up to the target level TBL. In this case, when memory cells that are adjacent to the DPGM cell are cells to be programmed (PGM Cell), the above-described coupling phenomenon attributable to parasitic capacitance may be more severe than the case of inhibit cells. Accordingly, the magnitude of the increased voltage of the bit line BL(DPGM Cell) that is coupled to the DPGM cell may vary based on the degree to which the threshold voltage of a memory cell that is coupled to a bit line that is adjacent to the bit line BL(DPGM Cell) that is coupled to the DPGM cell is to be increased. In detail, the increased voltage magnitude of the bit line BL(DPGM Cell) coupled to the DPGM cell may vary based on whether the memory cell that is coupled to the bit line that is adjacent to the bit line BL(DPGM Cell) that is coupled to the DPGM cell is a cell to be programmed (PGM Cell) or an inhibit cell.

A period from t3 to t4 may be a discharge period. The memory device 100 may apply the ground voltage Gnd to the selected word line Sel_WL during the discharge period Discharge. The memory device 100 may apply the ground voltage Gnd to the bit line BL(PGM Cell) that is coupled to the cell to be programmed, the bit line BL(Inhibit Cell) that is coupled to the inhibit cell, and the bit line BL(DPGM Cell) that is coupled to the DPGM cell during the discharge period.

Figure 9:
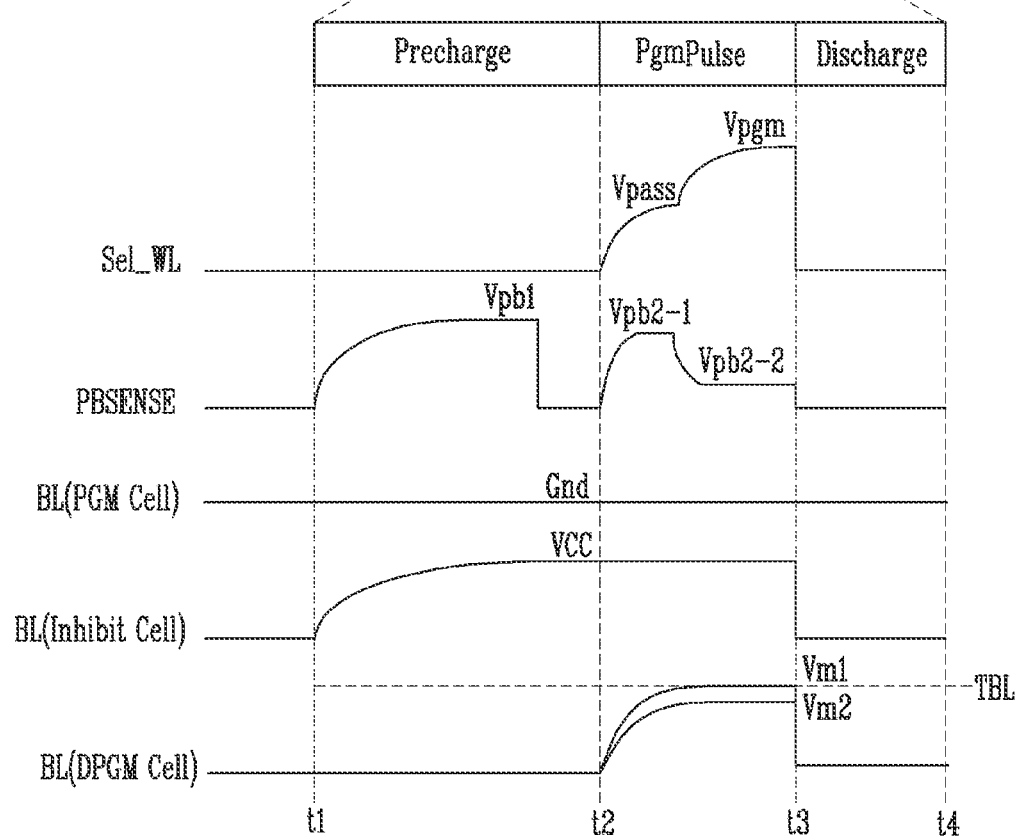
FIG. 9 is a diagram illustrating a program voltage apply operation in a program operation of a memory device according to an embodiment of the present disclosure.

FIG. 9 is a diagram illustrating a program voltage apply operation in a program operation of a memory device according to an embodiment of the present disclosure.

Repeated descriptions of configuration identical to that of FIG. 8 will be omitted in FIG. 9.

Referring to FIG. 9, the program operation of the memory device 100 may include a plurality of program loops PL1 to PLn. Each of the plurality of program loops PL1 to PLn may include a program voltage apply operation (PGM Step) and a verify operation (Verify Step).

The program voltage apply step (PGM Step) that is included in each of the plurality of program loops PL1 to PLn may include a precharge period Precharge, a program pulse period Pgm Pulse, and a discharge period Discharge.

A period from t1 to t2 may be a precharge period. The precharge period may be a period during which a bit line BL is precharged.

A period from t2 to t3 may be a program pulse period Pgm Pulse. During the program pulse period Pgm Pulse, a precharge control signal PBSENSE may rise to a 2-1-th control voltage Vpb2-1. The precharge control signal PBSENSE may rise to the 2-1-th control voltage Vpb2-1 for a preset period and may then decrease to a 2-2-th control voltage Vpb2-2. The 2-1-th control voltage Vpb2-1 may be lower than the first control voltage Vpb1. The 2-1-th control voltage Vpb2-1 may be higher than the second control voltage Vpb2, illustrated in FIG. 8. The voltage of the bit line BL(DPGM Cell) that is coupled to the DPGM cell may increase to the first precharge voltage Vm1 or the second precharge voltage Vm2 in response to the precharge control signal PBSENSE. In detail, when a bit line that is adjacent to the bit line BL(DPGM Cell)) that is coupled to the DPGM cell is a bit line BL(Inhibit Cell) that is coupled to an inhibit cell, the bit line BL(DPGM Cell) that is coupled to the DPGM cell may increase to the first precharge voltage Vm1 in response to the precharge control signal PBSENSE. That is, the voltage of the bit line BL(DPGM Cell) that is coupled to the DPGM cell may reach the target level TBL due to the 2-1-th control voltage Vpb2-1. Furthermore, due to the 2-1-th control voltage Vpb2-1, the voltage of the bit line BL(DPGM Cell) that is coupled to the DPGM cell may rapidly reach the target level TBL earlier than the time at which the voltage of the bit line BL(DPGM Cell) reaches the first precharge voltage Vm1 in FIG. 8. When the bit line that is adjacent to the bit line BL(DPGM Cell) that is coupled to the DPGM cell is a bit line BL(PGM Cell) that is coupled to the cell to be programmed, the voltage of the bit line BL(DPGM Cell) that is coupled to the DPGM cell may increase to the second precharge voltage Vm2 in response to the precharge control signal PBSENSE. The second precharge voltage Vm2, illustrated in FIG. 9, may have a higher voltage than the second precharge voltage Vm2, illustrated in FIG. 8. That is, the memory device 100 may overdrive the precharge control signal PBSENSE, thus enabling the voltage of the bit line BL(DPGM Cell) that is coupled to the DPGM cell to increase to a voltage closer to the target level TBL. Furthermore, the memory device 100 may overdrive the precharge control signal PBSENSE, thus enabling the difference between the magnitude of the first precharge voltage Vm1 and the magnitude of the second precharge voltage Vm2, illustrated in FIG. 9, to be smaller than the difference between the magnitude of the first precharge voltage Vm1 and the magnitude of the second precharge voltage Vm2, illustrated in FIG. 8. In addition, the voltage of the bit line BL(DPGM Cell) that is coupled to the DPGM cell increases to the voltage closer to the target level TBL, thus improving the threshold voltage distribution of the DPGM cell.

Figure 10:
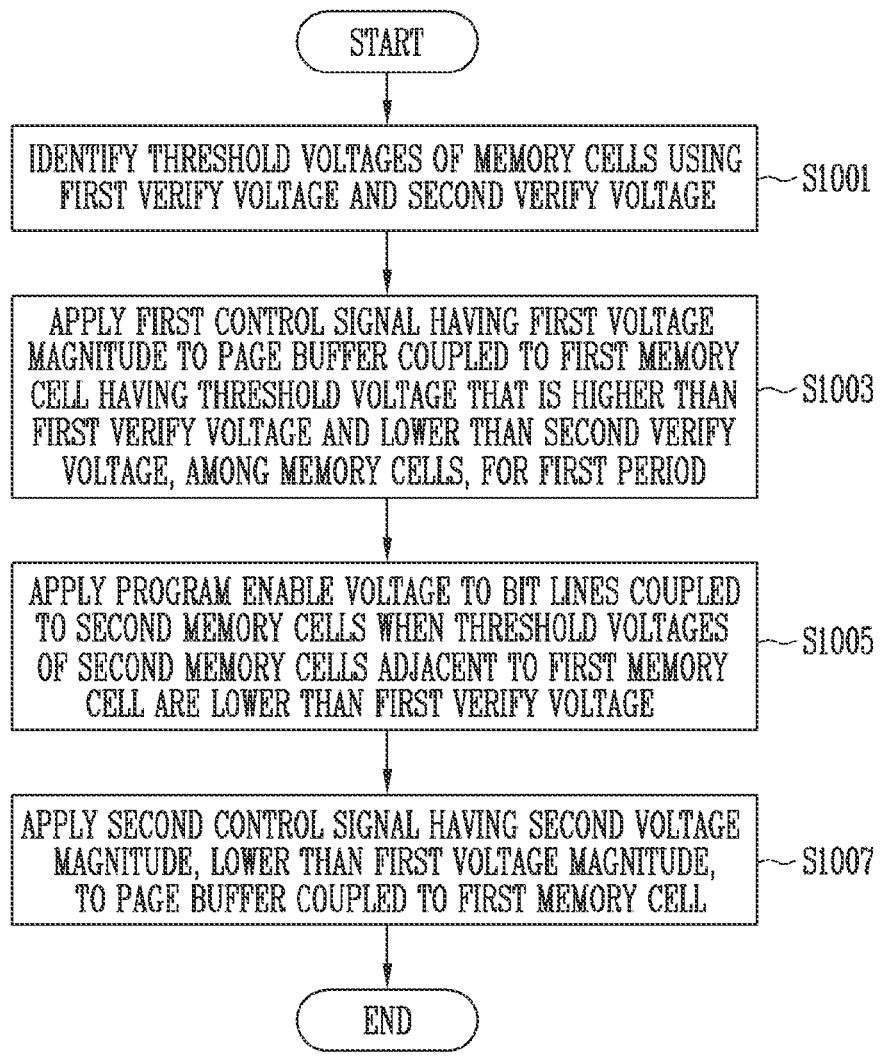
FIG. 10 is a flowchart illustrating a program operation according to an embodiment of the present disclosure.

FIG. 10 is a flowchart illustrating a program operation according to an embodiment of the present disclosure.

Referring to FIG. 10, at step S1001, the memory device 100 may identify the threshold voltages of memory cells by using a first verify voltage and a second verify voltage. The second verify voltage may have a higher voltage than the first verify voltage.

At step S1003, the memory device 100 may apply a first control signal having a first voltage magnitude to a page buffer that is coupled to a first memory cell having a threshold voltage that is higher than the first verify voltage and lower than the second verify voltage, among the memory cells, for a first period. The first memory cell may be a DPGM cell. In an embodiment, the memory device 100 may apply the first control signal to the page buffer that is coupled to the first memory cell and thereafter apply a program voltage to a word line that is coupled to the first memory cell.

At step S1005, when the threshold voltages of second memory cells that are adjacent to the first memory cell are lower than the first verify voltage, the memory device 100 may apply a program enable voltage to a bit line that is coupled to the second memory cells. The second memory cells may be cells to be programmed (PGM cells). In an embodiment, the memory device 100 may apply a program enable voltage to a bit line that is coupled to second memory cells and thereafter apply the first control signal to the page buffer that is coupled to the first memory cell.

At step S1007, the memory device 100 may apply a second control signal having a second voltage magnitude that is lower than the first voltage magnitude to the page buffer that is coupled to the first memory cell.

Figure 11:
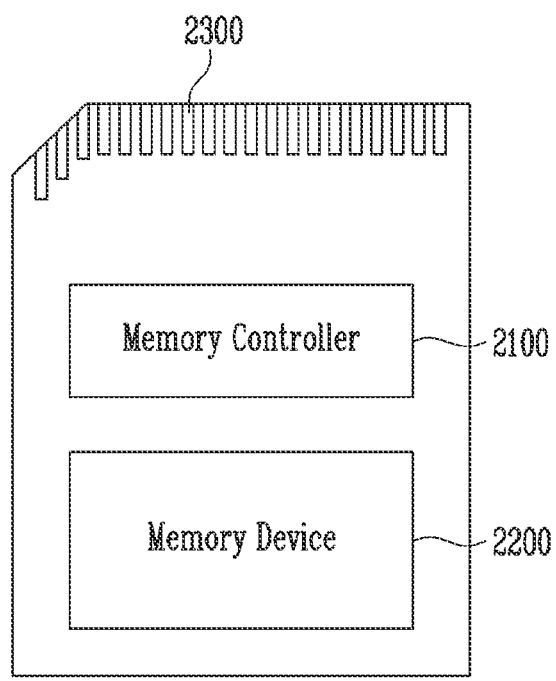
FIG. 11 is a block diagram illustrating a memory card system to which a memory system according to an embodiment of the present disclosure is applied.

FIG. 11 is a block diagram illustrating a memory card system to which a memory system according to an embodiment of the present disclosure is applied.

Referring to FIG. 11, a memory card system 2000 may include a memory controller 2100, a memory device 2200, and a connector 2300.

The memory controller 2100 is coupled to the memory device 2200. The memory controller 2100 may access the memory device 2200. For example, the memory controller 2100 may control read, write, erase, and background operations of the memory device 2200. The memory controller 2100 may provide an interface between the memory device 2200 and a host. The memory controller 2100 may run firmware for controlling the memory device 2200. The memory controller 2100 may be implemented in the same manner as the memory controller 200, described above with reference to FIG. 1. The memory device 2200 may be implemented in the same manner as the memory device 100, described above with reference to FIG. 1.

In an embodiment, the memory controller 2100 may include components, such as a RAM, a processor, a host interface, a memory interface, and an error correction circuit.

The memory controller 2100 may communicate with an external device through the connector 2300. The memory controller 2100 may communicate with an external device (e.g., a host) based on a specific communication standard or protocol. In an embodiment, the memory controller 2100 may communicate with the external device through at least one of various communication standards or protocols such as universal serial bus (USB), multimedia card (MMC), embedded MMC (eMMC), peripheral component interconnection (PCI), PCI-express (PCI-E), advanced technology attachment (ATA), serial-ATA (SATA), parallel-ATA (PATA), small computer system interface (SCSI), enhanced small disk interface (ESDI), integrated drive electronics (IDE), Firewire, universal flash storage (UFS), Wi-Fi, Bluetooth, and nonvolatile memory express (NVMe). In an embodiment, the connector 2300 may be defined by at least one of the above-described various communication standards or protocols.

In an embodiment, the memory device 2200 may be implemented as any one of various nonvolatile memory devices, such as an Electrically Erasable and Programmable ROM (EEPROM), a NAND flash memory, a NOR flash memory, a Phase-change RAM (PRAM), a Resistive RAM (ReRAM), a Ferroelectric RAM (FRAM), and a Spin Transfer Torque magnetic RAM (STT-MRAM).

The memory controller 2100 and the memory device 2200 may be integrated into a single semiconductor device to configure a memory card. For example, the memory controller 2100 and the memory device 2200 may be integrated into a single semiconductor device to configure a memory card, such as a PC card (personal computer memory card international association: PCMCIA), a compact flash card (CF), a smart media card (SM or SMC), a memory stick, a multimedia card (MMC, RS-MMC, MMCmicro or eMMC), a SD card (SD, miniSD, microSD, or SDHC), or a universal flash storage (UFS).

Figure 12:
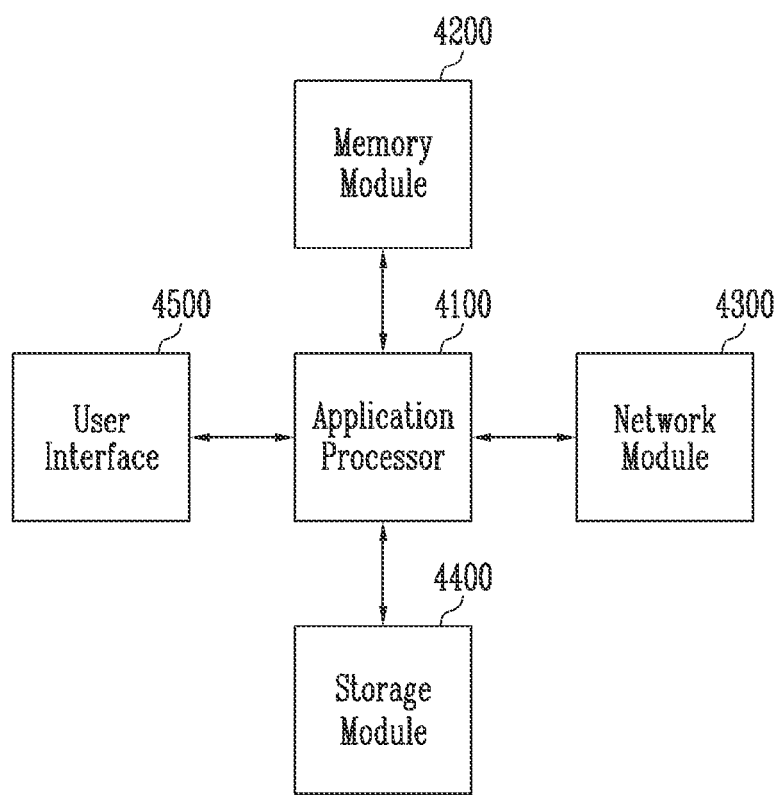
FIG. 12 is a block diagram illustrating a user system to which a memory system according to an embodiment of the present disclosure is applied.

FIG. 12 is a block diagram illustrating a user system to which a memory system according to an embodiment of the present disclosure is applied.

Referring to FIG. 12, a user system 4000 may include an application processor 4100, a memory module 4200, a network module 4300, a storage module 4400, and a user interface 4500.

The application processor 4100 may run components that are included in the user system 4000, an Operating System (OS), or a user program. In an embodiment, the application processor 4100 may include controllers, interfaces, graphic engines, etc. for controlling the components that are included in the user system 4000. The application processor 4100 may be provided as a system-on-chip (SoC).

The memory module 4200 may function as a main memory, a working memory, a buffer memory or a cache memory of the user system 4000. The memory module 4200 may include volatile RAMs, such as DRAM, SDRAM, DDR SDRAM, DDR2 SDRAM, DDR3 SDRAM, LPDDR SDRAM, LPDDR2 SDRAM, and LPDDR3 SDRAM or nonvolatile RAMs, such as PRAM, ReRAM, MRAM, and FRAM. In an embodiment, the application processor 4100 and the memory module 4200 may be packaged based on package-on-package (POP) and may then be provided as a single semiconductor package.

The network module 4300 may communicate with external devices. For example, the network module 4300 may support wireless communication, such as Code Division Multiple Access (CDMA), Global System for Mobile communication (GSM), wideband CDMA (WCDMA), CDMA-2000, Time Division Multiple Access (TDMA), Long Term Evolution (LTE), WiMAX, WLAN, UWB, Bluetooth, or Wi-Fi communication. In an embodiment, the network module 4300 may be included in the application processor 4100.

The storage module 4400 may store data. For example, the storage module 4400 may store data that is received from the application processor 4100. Alternatively, the storage module 4400 may transmit the data that is stored in the storage module 4400 to the application processor 4100. In an embodiment, the storage module 4400 may be implemented as a nonvolatile semiconductor memory device, such as a Phase-change RAM (PRAM), a Magnetic RAM (MRAM), a Resistive RAM (RRAM), a NAND flash memory, a NOR flash memory, or a NAND flash memory having a three-dimensional (3D) structure. In an embodiment, the storage module 4400 may be provided as a removable storage medium (i.e., removable drive), such as a memory card or an external drive of the user system 4000.

In an embodiment, the storage module 4400 may include a plurality of nonvolatile memory devices, each of which may be operated in the same manner as the memory device 100 described above with reference to FIG. 1. The storage module 4400 may be operated in the same manner as the memory system 50 described above with reference to FIG. 1.

The user interface 4500 may include interfaces that input data or instructions to the application processor 4100 or output data to an external device. In an embodiment, the user interface 4500 may include user input interfaces, such as a keyboard, a keypad, a button, a touch panel, a touch screen, a touch pad, a touch ball, a camera, a microphone, a gyroscope sensor, a vibration sensor, and a piezoelectric device. The user interface 4500 may further include user output interfaces, such as a Liquid Crystal Display (LCD), an Organic Light Emitting Diode (OLED) display device, an Active Matrix OLED (AMOLED) display device, an LED, a speaker, and a monitor.

In accordance with the present disclosure, there are provided a memory device that is capable of improving the threshold voltage distributions of memory cells during a program operation, and a method of operating the memory device.

What is claimed is:

1. A memory device, comprising:
a plurality of memory cells;
a peripheral circuit configured to perform a verify operation that identifies threshold voltages of the plurality of memory cells by using a first verify voltage and a second verify voltage that has a higher voltage than the first verify voltage; and
a program operation controller configured to control the peripheral circuit, after the verify operation is terminated and during a period in which a pass voltage and a program voltage are sequentially applied to a word line coupled to the plurality of memory cells, to:
while the pass voltage is applied to the word line, apply a first control signal having a first voltage magnitude to a page buffer that is coupled to a first memory cell, among the plurality of memory cells, the first memory cell having a threshold voltage that is higher than the first verify voltage and lower than the second verify voltage, and
while the program voltage is applied to the word line, apply a second control signal having a second voltage magnitude that is lower than the first voltage magnitude to the page buffer.

2. The memory device according to claim 1, wherein:
threshold voltages of second memory cells, among the plurality of memory cells, adjacent to the first memory cell have a lower voltage than the first verify voltage, and
the program operation controller is configured to control the peripheral circuit to apply, after the verify operation is terminated, a program enable voltage to a bit line that is coupled to the second memory cells.

3. The memory device according to claim 2, wherein the program operation controller is configured to control the peripheral circuit to apply the program enable voltage to the bit line that is coupled to the second memory cells and then apply the first control signal to the page buffer that is coupled to the first memory cell.

4. The memory device according to claim 3, wherein the program operation controller is configured to control the peripheral circuit to apply the first control signal to the page buffer that is coupled to the first memory cell and then apply the program voltage to the word line that is coupled to the plurality of memory cells.

5. The memory device according to claim 4, wherein:
a voltage of a bit line that is coupled to the first memory cell increases to a precharge voltage in response to the first and second control signals, and
the precharge voltage has a higher voltage than the program enable voltage.

6. The memory device according to claim 5, wherein the program enable voltage is a ground voltage.

7. The memory device according to claim 6, wherein the second verify voltage is a threshold voltage corresponding to a target program state of the plurality of memory cells.

8. The memory device according to claim 1, wherein:
threshold voltages of second memory cells, among the plurality of memory cells, adjacent to the first memory cell have a higher voltage than the second verify voltage, and the program operation controller is configured to control the peripheral circuit to apply, after the verify operation is terminated, a program-inhibit voltage to a bit line that is coupled to the second memory cells.

9. The memory device according to claim 8, wherein:
a voltage of a bit line that is coupled to the first memory cell increases to a precharge voltage in response to the first and second control signals, and
the precharge voltage has a lower voltage than the program-inhibit voltage.

10. The memory device according to claim 9, wherein the program inhibit voltage is a supply voltage.

11. A method of operating a memory device, comprising:
performing a verify operation that identifies threshold voltages of a plurality of memory cells by using a first verify voltage and a second verify voltage that has a higher voltage than the first verify voltage;
after the verify operation is terminated and during a period in which a pass voltage and a program voltage are sequentially applied to a word line coupled to the plurality of memory cells:
while the pass voltage is applied to the word line, applying a first control signal having a first voltage magnitude to a page buffer that is coupled to a first memory cell, among the plurality of memory cells, the first memory cell having a threshold voltage that is higher than the first verify voltage and lower than the second verify voltage; and
while the program voltage is applied to the word line, applying a second control signal having a second voltage magnitude that is lower than the first voltage magnitude to the page buffer that is coupled to the first memory cell.

12. The method according to claim 11, wherein:
threshold voltages of second memory cells that are adjacent to the first memory cell are lower than the first verify voltage, and
the method further comprises:
after the verify operation is terminated, applying a program enable voltage to a bit line that is coupled to the second memory cells.

13. The method according to claim 12, further comprising:
applying the program enable voltage to the bit line that is coupled to the second memory cells and then applying the first control signal to the page buffer that is coupled to the first memory cell.

14. The method according to claim 13, further comprising:
applying the pass voltage to the word line and then applying the program voltage to the word line.

15. The method according to claim 14, wherein:
a voltage of a bit line that is coupled to the first memory cell increases to a precharge voltage in response to the first and second control signals, and
the precharge voltage has a higher voltage than the program enable voltage.

16. The method according to claim 15, wherein the second verify voltage is a threshold voltage corresponding to a target program state of the plurality of memory cells.

17. The method according to claim 11, wherein:
threshold voltages of second memory cells that are adjacent to the first memory cell have a higher voltage than the second verify voltage, and
the method further comprises:
after the verify operation is terminated, applying a program-inhibit voltage to a bit line that is coupled to the second memory cells.

18. The method according to claim 17, wherein:
a voltage of a bit line that is coupled to the first memory cell increases to a precharge voltage in response to the first and second control signals, and
the precharge voltage has a lower voltage than the program-inhibit voltage.

* * * * *